(12) United States Patent
Babaran et al.

(10) Patent No.: US 9,184,120 B1
(45) Date of Patent: Nov. 10, 2015

(54) NONLEADED PACKAGE AND LEADFRAME STRIP AND METHOD

(71) Applicant: Texas Instruments Incorporated, Dallas, TX (US)

(72) Inventors: Dolores Parobrob Babaran, Baguio (PH); Mark Gerald Rosario Pinlac, Angeles (PH); Ramil Alfonso Viluan, Baguio (PH)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/454,203

(22) Filed: Aug. 7, 2014

(51) Int. Cl.
| H01L 23/495 | (2006.01) |
| H01L 23/28 | (2006.01) |
| H01L 21/78 | (2006.01) |
| H01L 21/48 | (2006.01) |
| H01L 21/56 | (2006.01) |

(52) U.S. Cl.
CPC ...... *H01L 23/49555* (2013.01); *H01L 21/4828* (2013.01); *H01L 21/565* (2013.01); *H01L 21/78* (2013.01); *H01L 23/28* (2013.01); *H01L 23/49503* (2013.01); *H01L 23/49537* (2013.01); *H01L 23/49582* (2013.01)

(58) Field of Classification Search
CPC ............... H01L 23/49548; H01L 23/49582; H01L 23/49541; H01L 2225/1058; H01L 23/49861; H01L 23/49551
See application file for complete search history.

(56) References Cited

U.S. PATENT DOCUMENTS

| 2007/0200207 | A1* | 8/2007 | Ramos et al. | 257/666 |
| 2008/0171405 | A1* | 7/2008 | Yee et al. | 438/109 |
| 2009/0159320 | A1* | 6/2009 | Sanjuan et al. | 174/260 |
| 2014/0151865 | A1* | 6/2014 | Koschmieder | 257/676 |

\* cited by examiner

*Primary Examiner* — Roy Potter
(74) *Attorney, Agent, or Firm* — Steven A. Shaw; Charles A. Brill; Frank D. Cimino

(57) ABSTRACT

A nonleaded IC package, such as a QFN, including an encapsulation block having at least one generally flat lateral sidewall surface; and a plurality of leads, each terminating in a generally chair-shaped flat surface that is flush with the generally flat lateral sidewall surface.

20 Claims, 8 Drawing Sheets

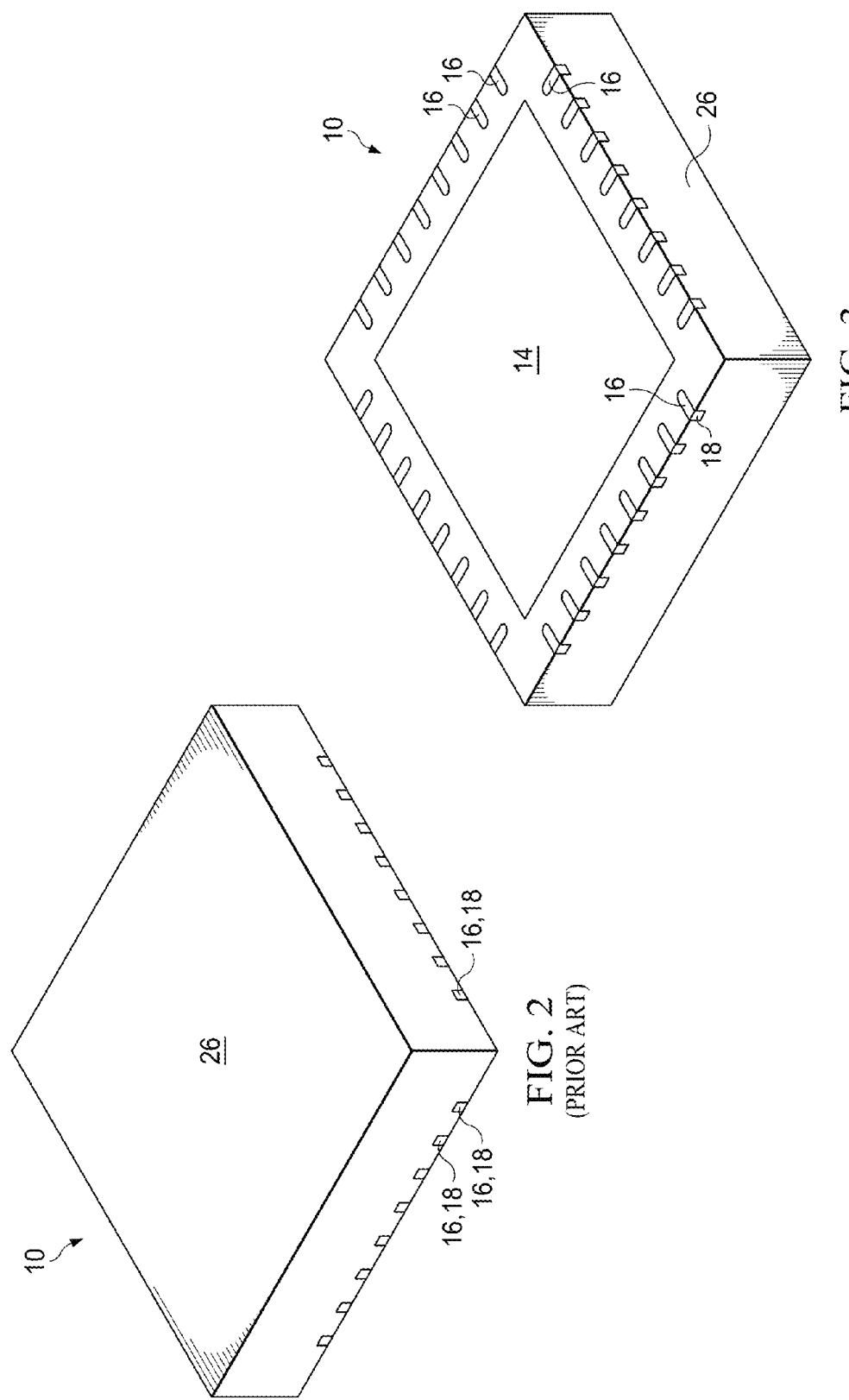

NONLEADED PACKAGE AND LEADFRAME STRIP AND METHOD

BACKGROUND

Integrated circuit ("IC") packages typically include a leadframe, at least one die mounted on the leadframe and electrically connected to leads of the leadframe and a layer of encapsulating material covering part or all of the components. Leads of the leadframe are used to connect the die or other electronics within the IC package to outside circuit boards and other electronic components.

There are many different types of IC packages and the packages are categorized based upon various criteria. One criterion is the package lead configuration. Some IC packages have leads that project outwardly from one or more sides of the package encapsulation block. Other IC packages, so called nonleaded packages, have lead surfaces that are exposed but flush with one or more outer wall surfaces of the encapsulation block, i.e., these leads do not project beyond the encapsulation block outer surface. One popular type of nonleaded package is the quad flat no-lead package ("QFN"), which has lead surfaces exposed at the surface of the encapsulation layer on all four lateral sides and also at the bottom of the package.

BRIEF DESCRIPTION OF THE DRAWINGS

FIG. 2 is a top isometric view of a prior art QFN.

FIG. 3 is a bottom isometric view of a prior art QFN.

DETAILED DESCRIPTION

Figure 1:
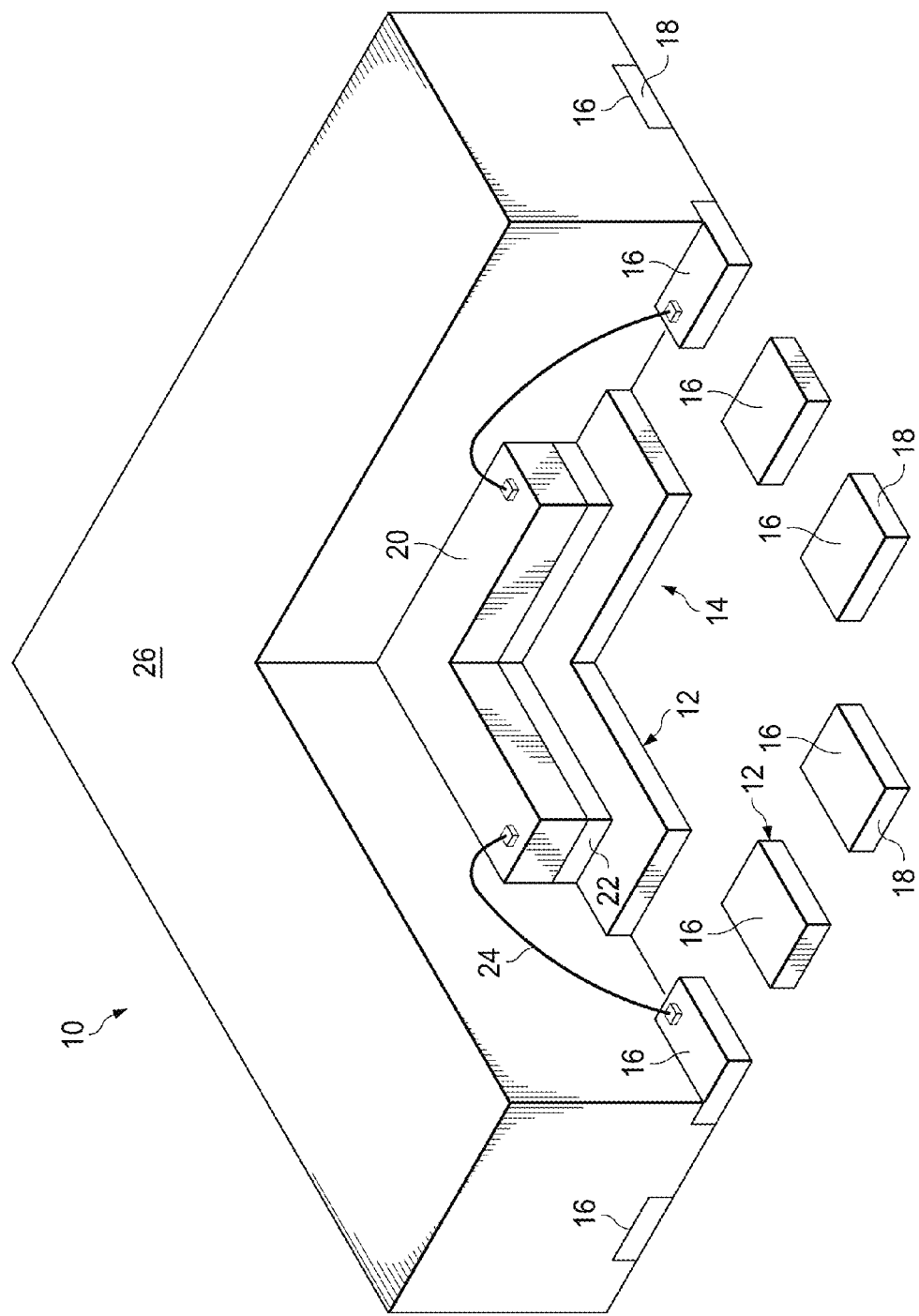
FIG. 1 is a cutaway isometric view of a prior art QFN integrated circuit package.
Figure 4:
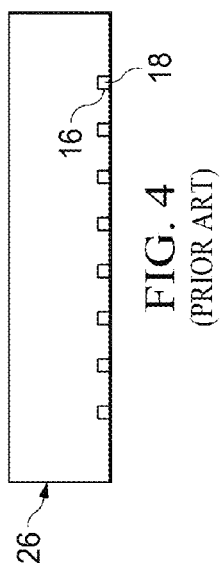
FIG. 4 is a side elevation view of a prior art QFN.
Figure 13:
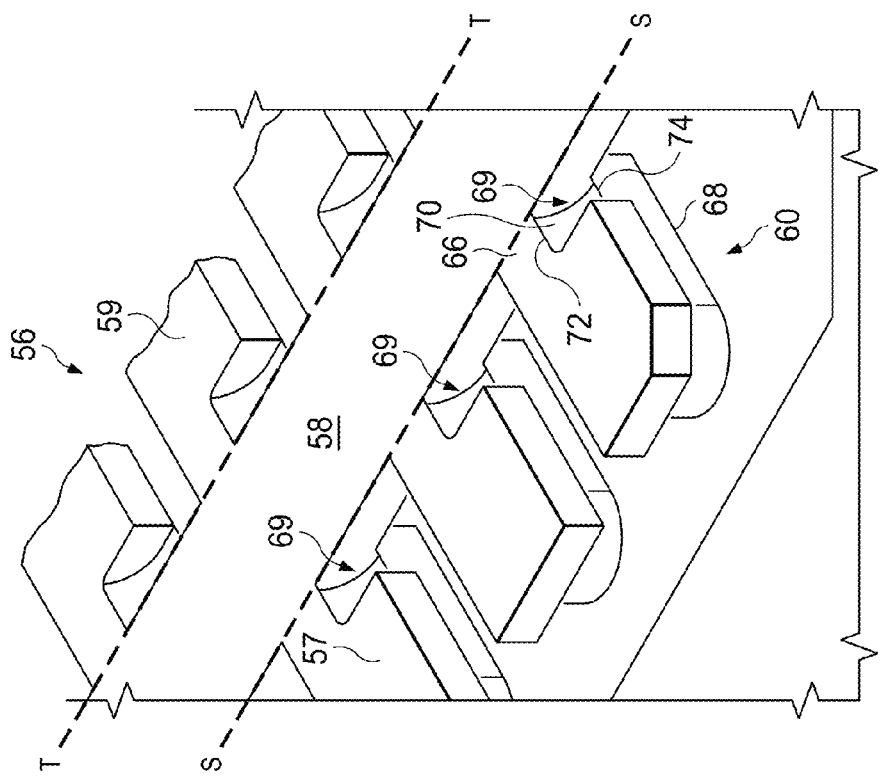
FIG. 13 is a detail isometric view of two interconnected leadframe portions of a leadframe strip, wherein the leads have end portions with a generally chair-shaped cross-section.

FIG. 1 one is a cutaway of a prior art nonleaded IC package, which in the illustrated embodiment, is a QFN-type IC package 10. FIGS. 2 and 3 are top and bottom isometric views of the package 10, and FIG. 4 is a side elevation view thereof. The package 10 comprises a leadframe 12, FIG. 1, which has a central die pad 14, sometimes referred to in the art as a die attached pad or die paddle or thermal pad. The leadframe 12 also comprises a plurality of leads 16, which each terminate in a rectangular lead face 18. An IC die 20 is mounted on the die pad by a layer of die attach material 22 such as adhesive. The plurality of leads 16 are electrically connected to the die 20 by bond wires 24. An encapsulating mold layer or mold block 26 covers the die and bond wires and fills the spaces between the die pad 14 and the leads 16. The terminal end faces 18 of the leads 16 are exposed at the lateral side surfaces 25 of the mold block 26. As shown in FIG. 13, the bottom surface of the die pad 14 is exposed at the bottom surface 29 of the mold block 26, as are bottom surfaces 21 of the leads 16.

Figure 5:
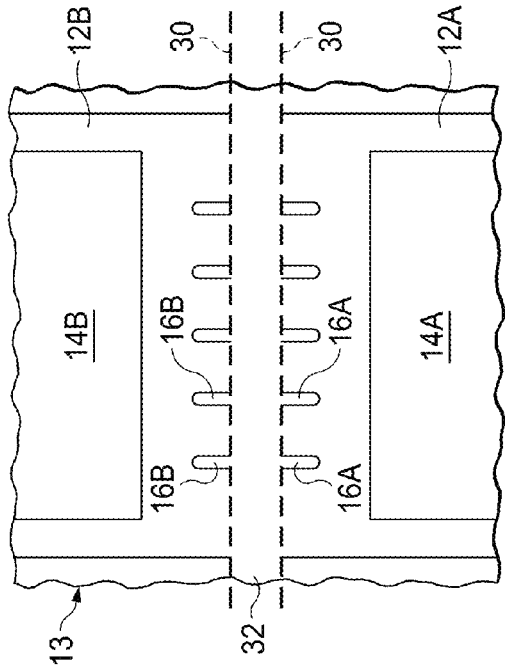
FIG. 5 is a top plan view of a portion of a prior art QFN-type leadframe.
Figure 6:
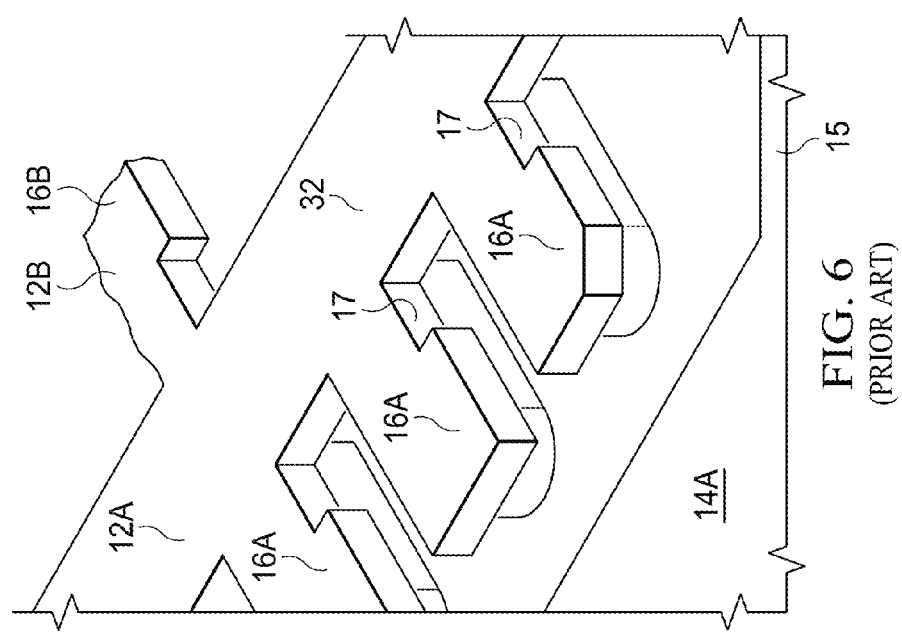
FIG. 6 is a detailed isometric view of a leadframe portion of a prior art leadframe strip.

A leadframe strip is typically formed by etching a thin sheet of copper or other conductive metal, FIG. 5 is a top plan view of a detail portion of a prior art QFN-type leadframe strip 13 that comprises two integrally connected lead frames 12A and 12B having leads 16A and 16B and die pads 14A and 14B, respectively. FIG. 6 is an isometric view of portions of one of the leadframes shown in FIG. 5. As shown by FIGS. 5 and 6, distal/outer ends of leads 16A of the first lead frame 12A are connected to distal/outer ends of leads 16B of the second lead frame 12B by a connecting bar 32. As described in further detail below, during QFN singulation, the connecting bar 32 is completely cut away to separate the lead frames 12A and 12B. This is done with a single saw cut along a saw street 30, shown by two dashed lines in FIG. 5. Each of the leads 16A or 16B has a proximal/inner end positioned near an associated die pad 14A, 14B.

Figure 7:
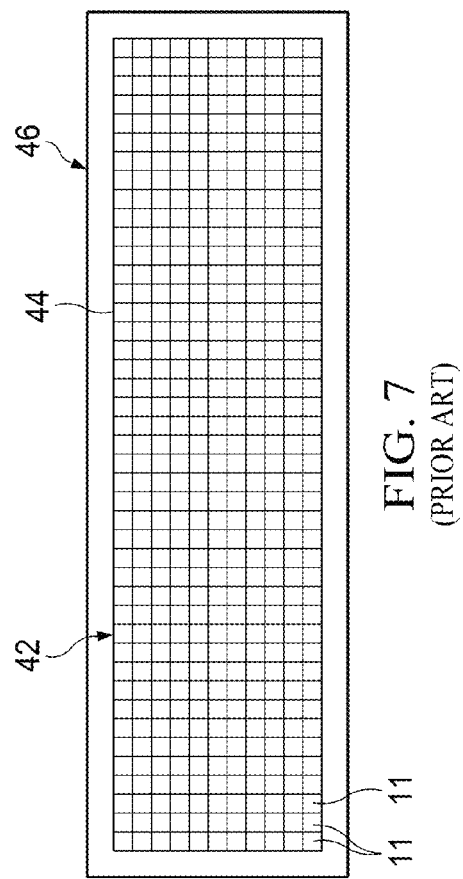
FIG. 7 is a top plan view of an encapsulated prior art lead frame strip mounted on a saw table.
Figure 8:
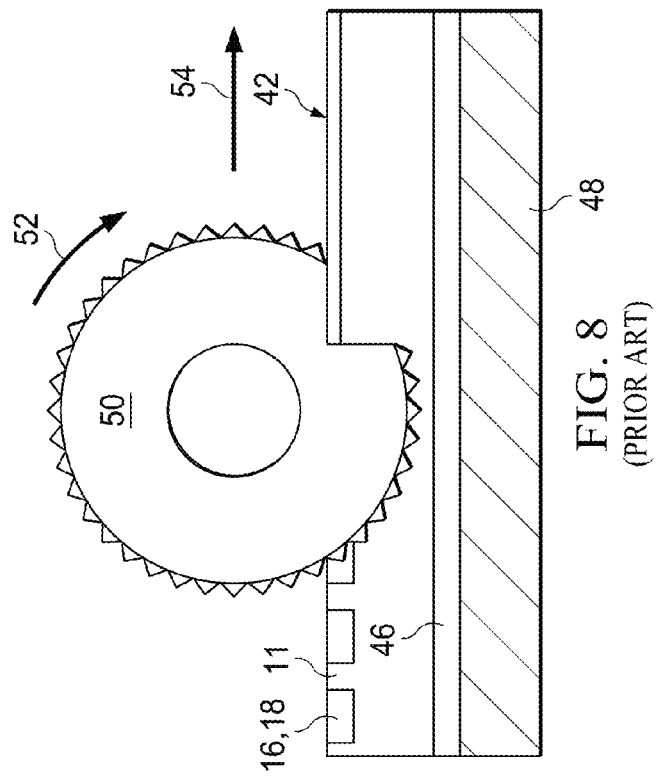
FIG. 8 is a side elevation view of a prior art encapsulated leadframe being singulated with a saw.

FIG. 7 is a top plan view of an encapsulated lead frame strip 42 mounted on a support assembly 46 of a saw table 48, FIG. 8. This encapsulated lead frame strip 42 will be saw singulated along a gridwork 44 of saw streets to form a plurality of individual IC packages, such as shown in FIGS. 1-4.

FIG. 8 is a schematic side elevation view, illustrating singulation of the prior art encapsulated leadframe strip 42 of FIG. 7. The encapsulated leadframe strip 42 is supported on a conventional vacuum type leadframe support assembly 46, which is in turn supported on a saw table 48 having a vacuum source associated therewith. The encapsulated lead frame strip 42 of FIG. 8, is cut by a conventional singulation saw 50. Singulation saw 50 rotates in direction 52 and cuts in linear direction 54. In FIG. 8, sawing has exposed the faces 18 of leads 16 of a partially singulated leadframe 11. The faces 16 are substantially coplanar with a cut side face of the mold block 26.

Figure 9:
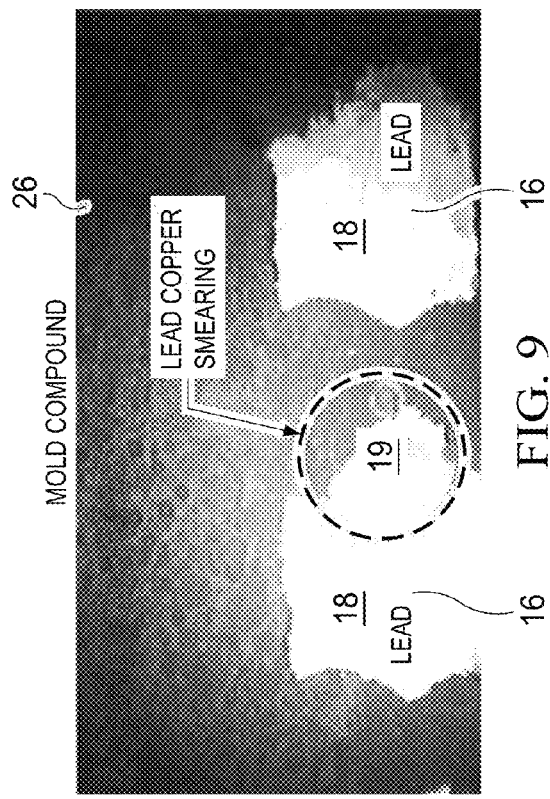
FIG. 9 is an enlarged detail photograph of applicants showing exposed leads of a QFN package that were smeared during singulation.

FIG. 9 is a magnified photograph taken by applicants. It illustrates end faces 18 of adjacent leads 16 of a conventional QFN after saw singulation thereof. It illustrates a significant smearing 19 in the downstream middle side edge of the first lead 16, caused by heat and friction from the saw blade. Applicants have discovered that this location of smearing on a lead face 18 is typical in QFN singulation. In some cases such smearing is sufficient to cause shorting between adjacent leads 16. Applicants have developed a new lead configuration, described below, which obviates most such shorting problems.

Figure 10:
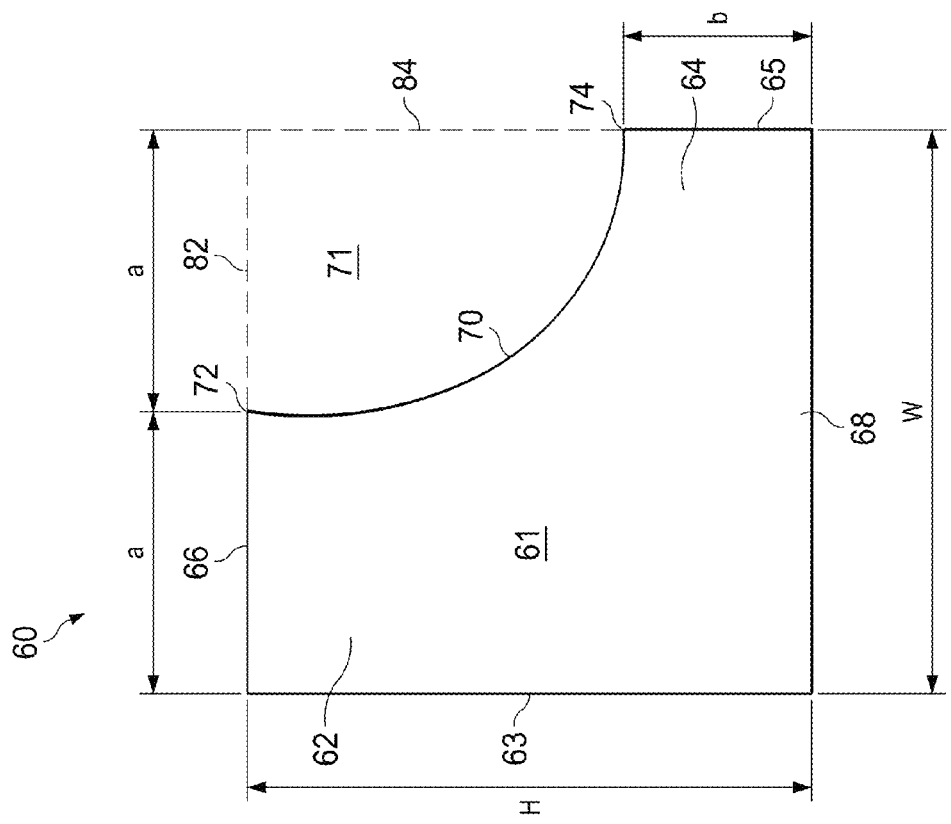
FIG. 10 is a schematic side elevation view of a cut, flat, terminal end face of a lead, which is generally chair-shaped.

FIG. 10 is a side elevation view of a new lead configuration developed by applicants. As shown by FIG. 10, the new lead 60 has a generally "L-shaped" or "chair-shaped" cut end face 61. The phrase "chair-shaped," as used herein, refers to the generally L-shaped configuration shown in FIG. 10, as well as the mirror image thereof, i.e. the term "chair-shaped" refers to both left facing chair shapes and right facing chair shapes.

With further reference to FIG. 10, the cut end face 61 has a first lateral side portion 62, which terminates at a rear surface 63 and top surface 66 and a second lateral side portion 64, which terminates at a forward surface 65 and curvilinear surface 70. Surface 70 extends from a forward most top point 72 of the first lateral side portion 62 to the forward most top point 74 of the second lateral side portion 64. The terms "rear" and "forward" are with reference to the linear cutting direction of a singulation saw, as indicated by arrow 54'. The first and second lateral side portions 62, 64, in the illustrated embodiment of FIG. 10, each have about the same width "a". The first lateral side portion 62 has the same height as the overall height, "H", of the end face 61. In this embodiment the height of the first lateral side portion is a constant height H, and thus represents both the minimum height and the maximum height of portion 62. The second lateral side portion 64 has a minimum height "b" at its intersection with forward surface 65, which is substantially less than "H". In one embodiment the minimum height of the second side portion 64 is less than about half the height H of the first portion 62, i.e., b is less than about H/2. In another embodiment the minimum height b of the second side portion 64 is about one third of the height H of the first portion 62, i.e., the height b is about H/3.

Figure 11:
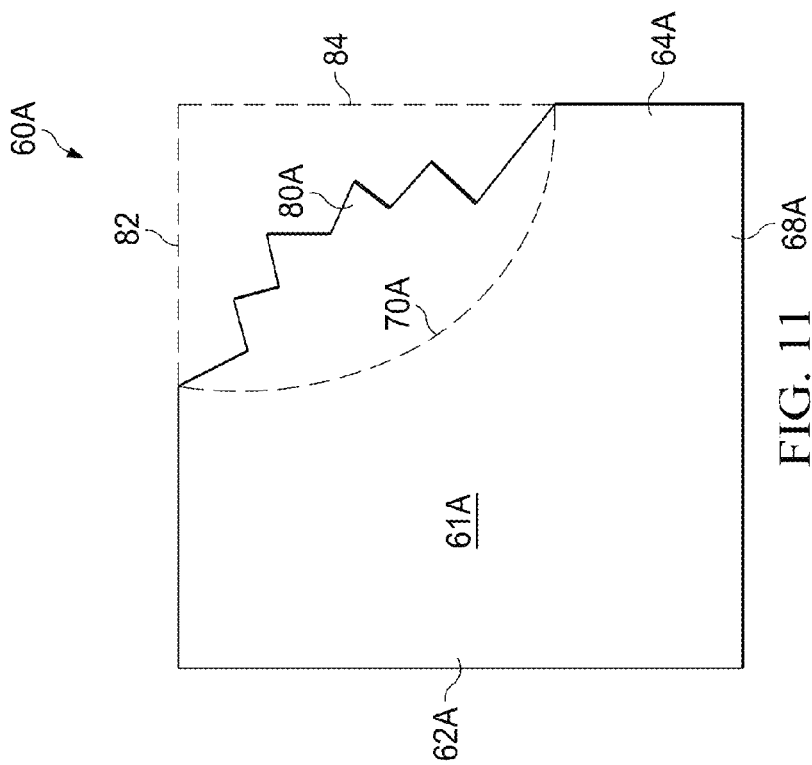
FIG. 11 is a schematic side elevation of the generally chair-shaped lead end face of FIG. 10, showing smearing thereof resulting from saw cutting.

FIG. 11 illustrates the cut end face 61A of the lead of FIG. 10, after a relatively high friction saw singulation. Reference numerals used in FIG. 11 are the same as those used in FIG. 10 except that the letter "A" has been added to each to indicate that lead 60A is a smeared lead, which originally had the chair-shaped cross section of FIG. 10. As shown in FIG. 11, a smearing portion 80A extends outwardly from the curvilinear transition surface 70A of the lead 60A. Applicant's new design has, in this illustration, not entirely eliminate smearing. However, as shown by dashed lines 82 and 84, the smearing 80A is limited to a region within the original rectangular outline of the lead cross section, i.e., the cross section of the lead before the recess that produced surface 70A was formed. It may thus be seen that, as a result of this recess formed in the lead 60A, smear portion 80A is located no closer to an adjacent lead than a right side surface of a lead of the original rectangular configuration was located prior to saw singulation. Thus, applicants have discovered that short circuits associated with smearing in singulated leads of the prior art configuration may be substantially reduced or virtually eliminated by use of applicants' new lead configuration.

FIG. 13 shows a saw street, defined by dashed lines SS and TT in leadframe strip 59. A singulation saw will saw through and remove the portion of the leadframe strip between lines SS and TT with a single cut, i.e., the width of the saw blade is about the same as the distance between lines SS and TT. FIG. 13 illustrates a leadframe strip 59 having recessed portions 69 formed therein. Such recessed portions 69 produce the generally chair-shaped end face configuration 61 shown in FIG. 10 when cut. Recessed portions 69 may be formed by use of conventional etching techniques on the leadframe strip 59. As best shown by FIG. 11 the recessed portion creates a curvilinear transition surface 70 and a generally flat surface 71 that extends perpendicular to surface 70.

Figure 12:
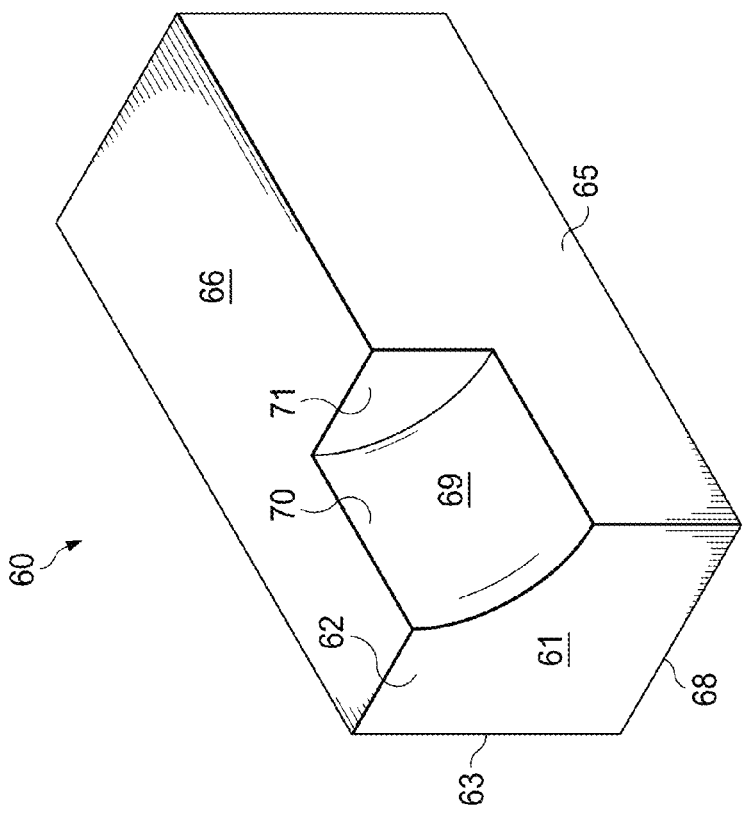
FIG. 12 is an isometric view of a lead frame lead having a recess therein that creates a generally chair-shaped cross-section.

In some embodiments, as illustrated in FIGS. 10-12, each of the leads 60 has a constant rectangular cross section from the inner end to the outer end thereof prior to formation of the recessed portion 69 therein. In other embodiments, as shown by dashed lines 84 in FIG. 13, the inner end of the lead 60 has a larger rectangular cross section than the outer end, even before the process that forms recess 69 in the outer end. In one specific embodiment, even before forming recess 69, the outer end portion of the lead 60 is narrower than the inner end portion.

Figure 14:
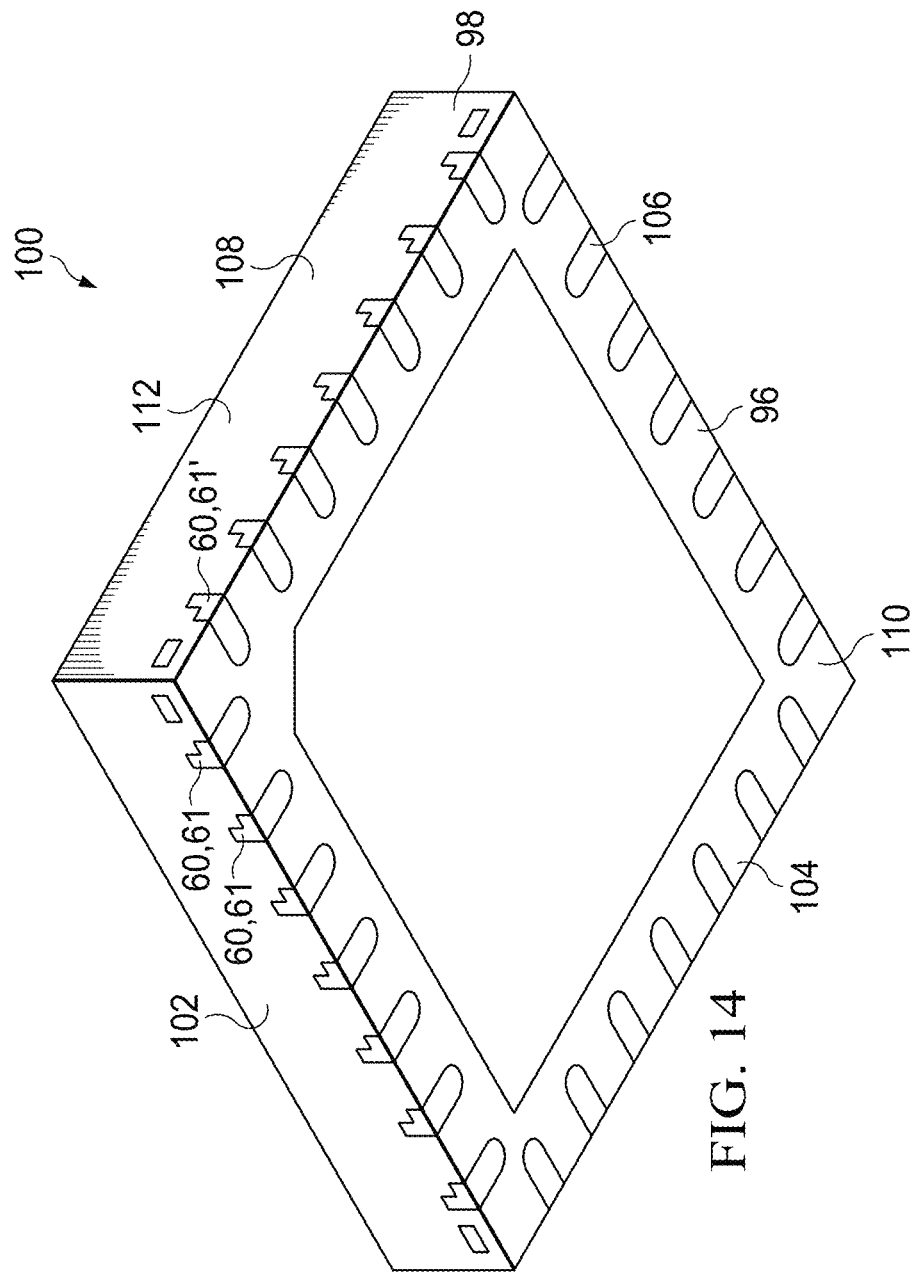
FIG. 14 is a bottom isometric view of a QFN package with leads that terminate in a generally chair-shaped, flat end faces that are flush with sidewalls of the package.

FIG. 14 is a bottom isometric view of a QFN 100 produced using a leadframe strip with applicants' new lead configuration having chair-shaped end faces 61 at the outer end of leads 60. The QFN 100 has four lateral faces 102, 104, 106, 108, a top face 110 and a bottom face 112. The outer end face 60 of each lead is positioned flush with an associated lateral side 102, etc., of the package. The bottom surface of each lead is flush with the bottom face 112 of the package. It may be seen from FIG. 14 that some of the leads 60 have a right facing generally chair-shaped cut end face surface shape 61 (i.e., recess 69 was formed on the right lateral side of the lead 60) and other leads 60 have a left facing generally chair-shaped end face surface shape 61'. In other words, lead faces 61 are mirror images of lead faces 61.

Figure 15:
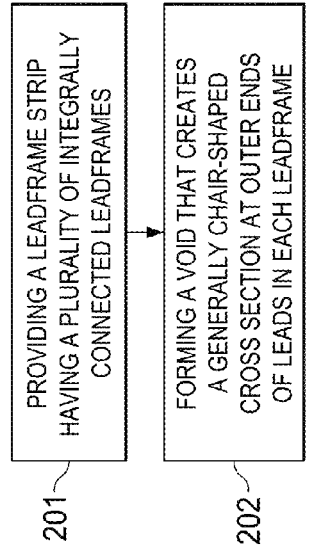
FIG. 15 is a flow chart of a method of making a plurality of nonleaded packages.

As illustrated by FIG. 15, a method of making a plurality of nonleaded packages may include, as shown at block 201, providing a leadframe strip having a plurality of integrally connected leadframes. The method may also include, as shown at 202, forming a void that creates a generally chair-shaped cross section at outer ends of leads in each leadframe.

Other method embodiments may include the steps shown in FIG. 15 plus various ones or all of the following steps: saw singulating the leadframe strip with saw cuts extending through each of the voids; forming the void by etching; molding the leadframe strip after the forming a void; singulating the molded leadframe strip with saw cuts that extend through each void and adjacent mold material; and/or during singulation, sawing off a connecting bar attaching aligned leads of adjacent leadframes with a single saw cut.

Although certain embodiments of leadframe strips and IC packages and methods of making nonleaded packages have been expressly described in detail herein, alternative embodiments thereof will occur to those skilled in the art after reading this disclosure. It is intended that the language of the appended claims be broadly construed to cover such alternative embodiments, except to the extent limited by the prior art.

What is claimed is:

1. A nonleaded IC package, such as a QFN, comprising:
   an encapsulation block having at least one generally flat lateral sidewall surface; and
   a plurality of leads, each terminating in a generally chair-shaped flat surface that is flush with said lateral sidewall.

2. The IC package of claim 1 wherein said generally chair-shaped flat surface comprises a first lateral portion and a second lateral portion having about the same width and wherein said first lateral portion has a minimum height and wherein said second lateral portion has a minimum height less than said minimum height of said first lateral portion.

3. The IC package of claim 2 wherein said second lateral portion has a minimum height of less than about half the minimum height of the second lateral portion.

4. The IC package of claim 2 wherein said second lateral portion has a minimum height of about one third the minimum height of said second lateral portion.

5. The IC package of claim 3 wherein said second lateral portion has a variable height that transitions continuously from said minimum height of said first lateral portion to said minimum height of said second lateral portion.

6. The IC package of claim 1 wherein each of said plurality of leads comprises:
   an outer end portion with a cross sectional width; and
   an inner end portion with a cross sectional width at least as large as said cross sectional width of said inner portion.

7. The IC package of claim 6 wherein said cross sectional width of said inner portion is larger than said cross sectional width of said outer portion.

8. The IC package of claim 6 wherein cross sectional width of said inner portion is about the same size as said cross sectional width of said outer portion.

9. The IC package of claim 1, wherein said generally chair-shaped flat surfaces of some leads face in a first direction and wherein said generally chair-shaped flat surfaces of other leads face in a second direction.

10. A leadframe strip for a nonleaded package comprising: a plurality of integrally connected leadframes, each including a
    a die pad; and
    a plurality of leads extending outwardly relative said die pad, each of said plurality of leads having an inner end portion proximate said die pad and an outer end portion remote from said die pad with each outer end portion comprising a generally chair-shaped cross section.

11. The leadframe strip of claim 10 wherein each of said leads comprises a generally rectangular cross section at said inner end portion.

12. The leadframe strip of claim 10 wherein the width of said generally rectangular cross section of said inner end is about the same as the width of said generally chair-shaped cross section of said outer end.

13. The leadframe strip of claim 10 wherein the width of said generally rectangular cross section of said inner end is larger than the width of said generally chair-shaped cross section of said outer end.

14. The leadframe of claim 10 wherein said generally chair-shaped cross section has a first lateral portion and a second lateral portion each having about the same lateral dimension and wherein each lateral portion has a minimum height and wherein the minimum height of said second lateral portion is less than about half the minimum height of said first lateral portion.

15. The leadframe of claim 14 wherein said minimum height of said second lateral portion is about one third said minimum height of said first lateral portion.

16. A method of making a plurality of nonleaded packages comprising:
    providing a leadframe strip having a plurality of integrally connected leadframes;
    forming a void that creates a generally chair-shaped cross section at outer ends of leads in each leadframe.

17. The method of claim 16 further comprising:
    saw singulating the leadframe strip with saw cuts extending through each of the voids.

18. The method of claim 16 wherein said forming a void comprises forming a void by etching.

19. The method of claim 16 comprising:
    molding the leadframe strip after said forming a void; and
    singulating the molded leadframe strip with saw cuts that extend through each void and adjacent mold material.

20. The method of claim 19 wherein said singulating comprises sawing off a connecting bar attaching aligned leads of adjacent leadframes.

* * * * *